United States Patent
Crowley et al.

(10) Patent No.: US 6,873,041 B1
(45) Date of Patent: Mar. 29, 2005

(54) POWER SEMICONDUCTOR PACKAGE WITH STRAP

(75) Inventors: Sean T. Crowley, Phoenix, AZ (US); William M. Anderson, Gilbert, AZ (US); Bradley D. Boland, Gilbert, AZ (US); Eelco Bergman, Sunnyvale, CA (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/618,192

(22) Filed: Jul. 11, 2003

Related U.S. Application Data (63) Continuation of application No. 10/008,048, filed on Nov. 7, 2001, now Pat. No. 6,630,726.

(51) Int. Cl.[7] .......................... H01L 23/48; H01L 23/52
(52) U.S. Cl. ...................... 257/692; 257/693; 257/687; 257/690
(58) Field of Search .................................. 257/100, 666, 257/668, 670, 676, 692, 693, 734, 687, 690; 361/723, 813

(56) References Cited

U.S. PATENT DOCUMENTS

| | | |
|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |

(Continued)

FOREIGN PATENT DOCUMENTS

| | | |
|---|---|---|
| DE | 19734794 A1 | 8/1997 |
| EP | 5421117 | 6/1979 |
| EP | 5950939 | 3/1984 |
| EP | 0393997 | 10/1990 |
| EP | 0459493 | 12/1991 |
| EP | 0720225 | 3/1996 |
| EP | 07200234 | 3/1996 |
| EP | 0794572 A2 | 10/1997 |
| EP | 0844665 | 5/1998 |
| EP | 0936671 | 8/1999 |
| EP | 098968 | 3/2000 |
| EP | 1032037 | 8/2000 |

(Continued)

*Primary Examiner*—Steven Loke
(74) *Attorney, Agent, or Firm*—Stetina Brunda Barred & Brucker (57) ABSTRACT

A semiconductor package and a method for fabricating a semiconductor package are disclosed. In one embodiment, the semiconductor package includes an exposed portion of a conductive strap at a package horizontal first surface and exposed surfaces of multiple leads at a package horizontal second surface. A power semiconductor die is mounted on a die pad connected to at least one lead having an exposed surface. Heat generated by the die within the package may be dissipated through thermal paths including the exposed surfaces.

18 Claims, 7 Drawing Sheets

U.S. PATENT DOCUMENTS

| | | |
|---|---|---|
| 4,451,224 A | 5/1984 | Harding |
| 4,530,152 A | 7/1985 | Roche et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,604,376 A | 2/1997 | Hamburgen et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |

| | | |
|---|---|---|
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,722 A | 7/2000 | Lee et al. |
| 6,100,594 A | 8/2000 | Fukui et al. |
| 6,113,473 A | 9/2000 | Costantini et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,629 B1 | 7/2001 | Niones et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |

| | | | |
|---|---|---|---|
| 6,303,997 B1 | 10/2001 | Lee | |
| 6,307,272 B1 | 10/2001 | Takahashi et al. | |
| 6,309,909 B1 | 10/2001 | Ohgiyama | |
| 6,316,838 B1 | 11/2001 | Ozawa et al. | |
| 6,323,550 B1 | 11/2001 | Martin et al. | |
| 6,326,243 B1 | 12/2001 | Suzuya et al. | |
| 6,326,244 B1 | 12/2001 | Brooks et al. | |
| 6,326,678 B1 | 12/2001 | Karnezos et al. | |
| 6,335,564 B1 | 1/2002 | Pour | |
| 6,339,255 B1 | 1/2002 | Shin | |
| 6,348,726 B1 | 2/2002 | Bayan et al. | |
| 6,355,502 B1 | 3/2002 | Kang et al. | |
| 6,369,454 B1 | 4/2002 | Chung | |
| 6,373,127 B1 | 4/2002 | Baudouin et al. | |
| 6,380,048 B1 | 4/2002 | Boon et al. | |
| 6,384,472 B1 | 5/2002 | Huang | |
| 6,388,336 B1 | 5/2002 | Venkateshwaran et al. | |
| 6,395,578 B1 | 5/2002 | Shin et al. | |
| 6,400,004 B1 | 6/2002 | Fan et al. | |
| 6,414,385 B1 | 7/2002 | Huang et al. | |
| 6,420,779 B1 | 7/2002 | Sharma et al. | |
| 6,429,508 B1 | 8/2002 | Gang | |
| 6,437,429 B1 | 8/2002 | Su et al. | |
| 6,444,499 B1 | 9/2002 | Swiss et al. | |
| 6,448,633 B1 | 9/2002 | Yee et al. | |
| 6,452,279 B2 | 9/2002 | Shimoda | |
| 6,464,121 B2 | 10/2002 | Reijnders | |
| 6,476,469 B2 | 11/2002 | Hung et al. | |
| 6,476,474 B1 | 11/2002 | Hung | |
| 6,482,680 B1 | 11/2002 | Khor et al. | |
| 6,498,099 B1 | 12/2002 | McLellan et al. | |
| 6,498,392 B2 | 12/2002 | Azuma | |
| 6,507,096 B2 | 1/2003 | Gang | |
| 6,507,120 B2 | 1/2003 | Lo et al. | |
| 6,534,849 B1 | 3/2003 | Gang | |
| 6,559,525 B2 | 5/2003 | Huang | |
| 6,566,164 B1 * | 5/2003 | Glenn et al. | 438/107 |
| 6,566,168 B2 | 5/2003 | Gang | |
| 6,630,726 B1 * | 10/2003 | Crowley et al. | 257/666 |
| 2001/0008305 A1 | 7/2001 | McClellan et al. | |
| 2001/0014538 A1 | 8/2001 | Kwan et al. | |
| 2002/0011654 A1 | 1/2002 | Kimura | |
| 2002/0024122 A1 | 2/2002 | Jung et al. | |
| 2002/0027297 A1 | 3/2002 | Ikenaga et al. | |
| 2002/0140061 A1 | 10/2002 | Lee | |
| 2002/0140068 A1 | 10/2002 | Lee et al. | |
| 2002/0163015 A1 | 11/2002 | Lee et al. | |
| 2003/0030131 A1 | 2/2003 | Lee et al. | |
| 2003/0073265 A1 | 4/2003 | Hu et al. | |

FOREIGN PATENT DOCUMENTS

| | | |
|---|---|---|
| JP | 55163868 | 12/1980 |
| JP | 5745959 | 3/1982 |
| JP | 58160095 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 629639 | 1/1987 |
| JP | 63067762 | 3/1988 |
| JP | 63205935 | 8/1988 |
| JP | 63233555 | 9/1988 |
| JP | 63249345 | 10/1988 |
| JP | 63316470 | 12/1988 |
| JP | 64054749 | 3/1989 |
| JP | 1106456 | 4/1989 |
| JP | 1175250 | 7/1989 |
| JP | 1251747 | 10/1989 |

| | | | | | | |
|---|---|---|---|---|---|---|
| JP | 3177060 | 8/1991 | | JP | 992775 | 4/1997 |
| JP | 4098864 | 3/1992 | | JP | 9293822 | 11/1997 |
| JP | 5129473 | 5/1993 | | JP | 10022447 | 1/1998 |
| JP | 5166992 | 7/1993 | | JP | 10163401 | 6/1998 |
| JP | 5283460 | 10/1993 | | JP | 10199934 | 7/1998 |
| JP | 692076 | 4/1994 | | JP | 10256240 | 9/1998 |
| JP | 6140563 | 5/1994 | | JP | 00150765 | 5/2000 |
| JP | 6260532 | 9/1994 | | JP | 556398 | 10/2000 |
| JP | 7297344 | 11/1995 | | JP | 2001060648 | 3/2001 |
| JP | 7312404 | 11/1995 | | JP | 200204397 | 8/2002 |
| JP | 864634 | 3/1996 | | KR | 941979 | 1/1994 |
| JP | 8083877 | 3/1996 | | KR | 9772358 | 11/1997 |
| JP | 8125066 | 5/1996 | | KR | 100220154 | 6/1999 |
| JP | 8222682 | 8/1996 | | KR | 0049944 | 6/2002 |
| JP | 8306853 | 11/1996 | | WO | 9956136 | 11/1999 |
| JP | 98205 | 1/1997 | | WO | 9967821 | 12/1999 |
| JP | 98206 | 1/1997 | | | | |
| JP | 98207 | 1/1997 | | * cited by examiner | | |

FIG. 12

POWER SEMICONDUCTOR PACKAGE WITH STRAP

This application is a continuation of application Ser. No. 10/008,048 filed on Nov. 7, 2001, now U.S. Pat. No. 6,630,726.

BACKGROUND

1. Field of the Invention

The present invention relates to semiconductor packaging, and more particularly to a semiconductor package with an electrically-conductive strap for power applications.

2. Description of the Related Art

Integrated circuit die are conventionally enclosed in plastic packages that provide protection from hostile environments and enable electrical interconnection between the integrated circuit die and printed circuit boards. The package elements may include, for example, a metal leadframe, a die, bonding material to attach the die to the leadframe, bond wires that electrically connect pads on the die to individual leads of the leadframe. A hardened plastic encapsulant material typically covers the die, the bond wires, at least a portion of the leadframe, and forms the exterior of the package.

The leadframe is typically the central supporting structure of such a package. A portion of the leadframe is internal to the package. That is, the plastic encapsulant material conventionally surrounds a central portion of the leadframe with lead portions of the leadframe extending externally outward from the sides of the package. The externally extending lead portions may be used to connect the package to external circuitry.

In conventional eight-lead, small outline integrated circuit ("SOIC-8") high-power metal-oxide-semiconductor field effect transistor ("PMOSFET") packages, the sources and drains of the individual transistor devices of the PMOSFET are typically connected in parallel by respective thin layers of metal on the opposed surface of the die, which, in turn, are electrically coupled to the leads of the package. This thin layer of metal, in turn, is externally connected to each of three leads of the package.

In conventional versions of this type of package, the conductive layer spanning the sources of the individual transistor devices are connected to the leads (or an intermediate structure) of a package substrate by a relatively large number (typically 14) of parallel bond wires. However, these wires have contributed to a number of problems associated with this type of device, including relatively high internal thermal and electrical resistances.

More recently, it has been learned that at least some of the foregoing problems can be alleviated by replacing the large number of bond wires with a single, elongated conductive strap that connects the thin layer of metal on top of the die to the source leads of the substrate. This approach, however, has also been somewhat problematic due to the inability of this design to effectively dissipate heat generated by the die. Accordingly, a need exists to provide a semiconductor package that provides for greater, or improved, heat dissipation capabilities.

SUMMARY OF THE INVENTION

A semiconductor package is provided that includes a die pad with a semiconductor die disposed thereon and a plurality of leads electrically coupled to the die via a conductive strap. Each of the leads has opposing first and second surfaces. An encapsulant material encapsulates the die, at least a portion of the die pad, at least a portion of the strap, and at least a portion of lead first surfaces. Second surfaces of the leads may be exposed in a plane of a horizontal exterior surface of the encapsulant, thereby permitting external electrical connectivity to the package and dissipation of heat through the lead second surfaces. A surface of the die pad and/or leads connected to the die pad also may be exposed at the horizontal exterior package surface. The exposed surfaces of the die pad and leads may be adjacent to or surrounded by recessed surfaces that are under-filled by the encapsulant material and are thus locked to the encapsulant material.

In one embodiment, a portion of the conductive strap is exposed through, and may be substantially flush with, a horizontal exterior surface of the encapsulant material opposite the die pad and leads. The exposed lead surfaces, the exposed portion of the conductive strap, and the exposed portion of the die pad provide multiple thermal paths for dissipation of heat generated by the die to the external environment.

A power MOSFET embodiment of the package conforms to a standard eight-lead small outline integrated circuit (SOIC-8) package style and has better heat dissipation capabilities than conventional SOIC-8 packages. In addition, because the leads and die pad are in the plane of the horizontal exterior surface, the package is very thin.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

The present application has some relation to semiconductor packages and methods disclosed in U.S. patent application Ser. Nos. 09/536,236, 09/587,136, 09/816,852, and 09/733,148, all of which are expressly incorporated herein by reference in their respective entireties. The present invention may be applied to some or all of the semiconductor packages disclosed in these applications. Further, the assembly methods disclosed in these applications may be modified in accordance with the present invention.

Figure 1:
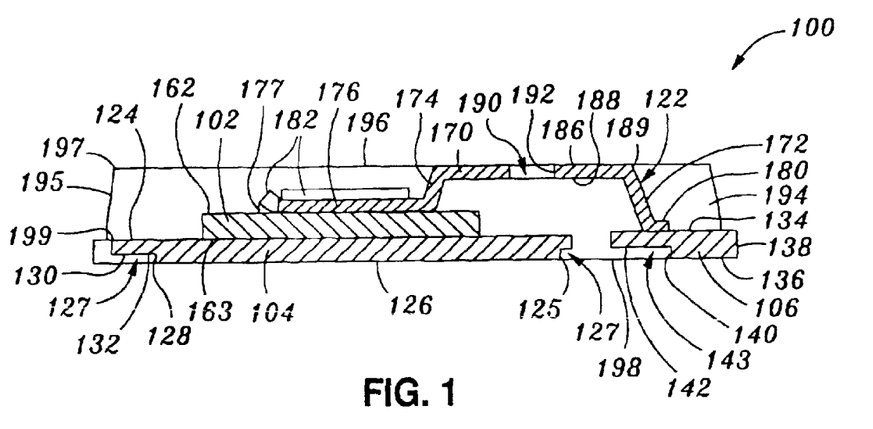
FIG. 1 is a cross-sectional side view of a semiconductor package in accordance with an embodiment of the present invention.
Figure 2:
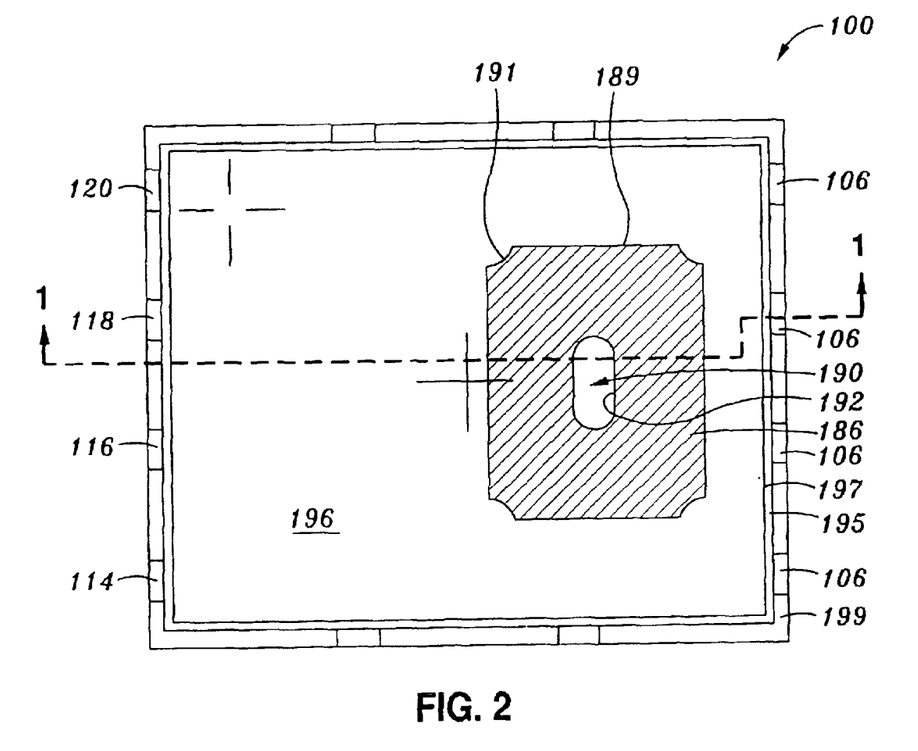
FIG. 2 is a top plan view of the semiconductor package of FIG. 1.
Figure 3:
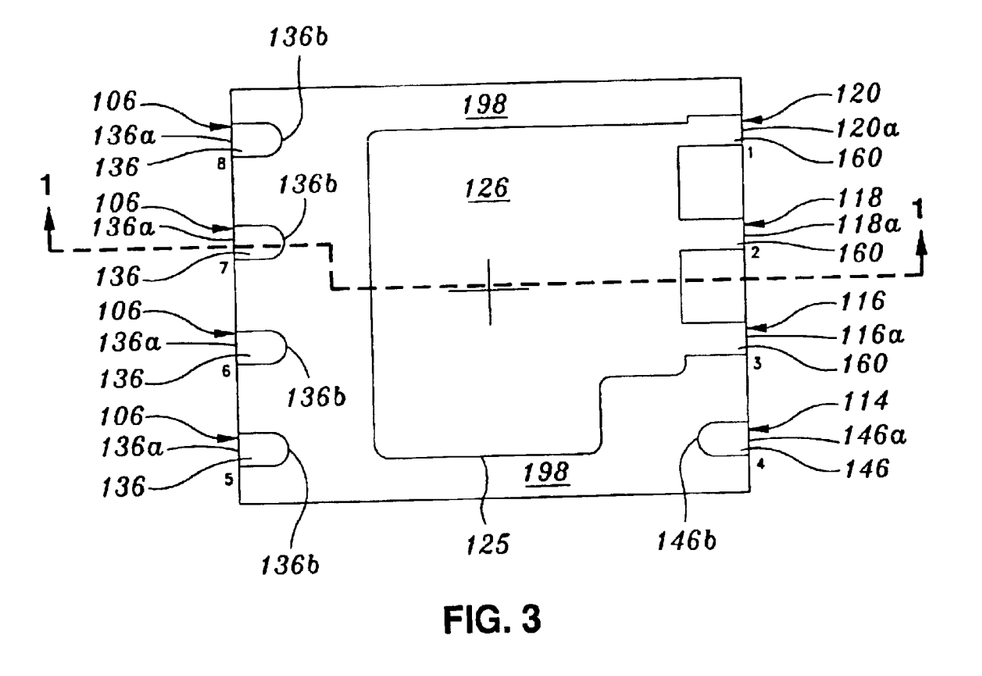
FIG. 3 is a bottom plan view of the semiconductor package of FIG. 1.

FIGS. 1–3 show a lead frame semiconductor package 100 in accordance with one embodiment of the present invention. The semiconductor package 100 includes a semiconductor die 102, a metal die pad 104, a first set of metal leads 106, a second set of metal leads 114, 116, 118, and 120, and a conductive strap 122.

The die pad 104 has a first surface 124 (FIG. 1) and a second surface 126 and has a recessed portion 127 formed about the entire periphery thereof. A lateral edge surface 128 and a transverse surface 130 that are generally orthogonal and intersect along a recessed portion inside corner 132 generally define the recessed portion 127. The lateral edge surface 128 is substantially orthogonal to the second surface 126 of the die pad 104 and intersects the second surface 126 of the die pad 104 along corner 125. The corner 125 generally defines the second surface 126 of the die pad 104.

The transverse surface 130 of the recessed portion 127 may be substantially parallel with the first and second surfaces 124 and 126 of the die pad 104 and may be substantially perpendicular to the lateral edge surface 128. The recessed portion 127 may be formed by techniques such as etching, coining, stamping, or the like. During molding, encapsulant material 194 is permitted to enter into and generally under-fill the recessed portion 127 to secure the die pad 104 within the package 100 while permitting the second surface 126 of the die pad 104 to be exposed through lower horizontal second surface 198 of the encapsulant material 194 for external electrical connection.

The leads 106 each have opposing first and second surfaces 134 and 136, which are generally parallel to each other. The second surface 136 of each lead 106 extends between and intersects a corresponding external lateral edge 138 and a corresponding internal lateral edge 140. The internal lateral edge 140 and a corresponding transverse surface 142 are generally orthogonal and define a recessed portion 143 adjacent the second surface 136 of each of the leads 106. In one embodiment, the leads 106 are drain leads, in that they are electrically coupled to the drain terminal of PMOSFET semiconductor die 102.

During molding, the encapsulant material 194 is permitted to enter into and generally under-fill the recessed portion 143 of each of the leads 106 to secure the leads 106 within the package 100 while permitting the second surfaces 136 of the leads 106 to be exposed through the lower horizontal second surface 198 of the encapsulant material 194 for external electrical connection.

The lead 114 (FIG. 3) has an exposed surface 146. The lead 114 has the same configuration as the leads 106, as discussed above, including an inner recessed portion (not shown) like the recessed portion 143 of lead 106 that is under-filled by encapsulant material 194. A surface 146 of lead 14 is exposed and coplanar with second surface 136 of leads 106 in the plane of lower horizontal second surface 198 of encapsulant material 194 for external electrical connection. In one embodiment, an upper encapsulated surface (not shown) of lead 114 is electrically coupled in a flipchip style connection to a gate terminal of a PMOSFET die 102.

The inner edge 136b of exposed second surface 136 of leads 106 and the inner edge 146b of exposed surface 146 of lead 114 is rounded, which can facilitate the encapsulation process, help avoid delamination, and reduce stress concentration points. Corners of exposed second surface 126 of die pad 104 may be rounded for the same reasons.

The leads 116, 118, 120 (FIG. 3) may be formed integrally with or may be fused to the die pad 104. Each of leads 116, 118, 120 includes an exposed second surface 160. The second surfaces 160 of the leads 116, 118, 120 may be coplanar with the second surface 126 of the die pad 104 and the second surface 198 of the encapsulant 194.

The outer edges 136a, 146a, 116a, 118a, and 120a of leads 106, 114, and 116, 118, and 120, respectively, are generally orthogonal and, in this embodiment, extend slightly beyond the tapered sidewalls 195 of encapsulant material 194. Typically, the outer edges 136a, 146a, 116a, 118a, and 120a are formed by severing the leads from a leadframe, such as with a punch or saw.

The die 102, which may comprise a PMOSFET device, is mounted on the first surface 124 of the die pad 104. The die 102 includes opposing first and second surfaces 162 and 163, which may be substantially parallel to each other. The second surface 163 of the die 102 is mounted on the first surface 124 of the die pad 104 with metal solder, an electrically conductive die attach adhesive, or other conventional conductive die attach means. In one embodiment, the leads 116, 118, 120 are source leads in that they are integrally coupled with die pad 104, which, in turn, is electrically coupled to the source terminal of a PMOSFET die 102.

The strap 122 is formed of an electrically conductive material, such as stamped copper or an alloy thereof, and includes a planar uppermost cover portion 170 disposed between and formed integrally with an inclined first connection portion 172 and an inclined second connection portion 174. The strap 122 also includes a flange portion 176 formed integrally with the second connection portion 174 of the strap 122. The flange portion 176 of the strap 122 is mounted on and is electrically and thermally coupled to the first surface 162 of the die 102 by a conductive layer 177, such as solder or an electrically conductive adhesive epoxy. The strap 122 also includes at least one horizontally extending peripheral foot 180 formed integrally with the first connection portion 172 of the strap 122. Foot 180 is mounted on, and is thermally and electrically coupled to first surface 134 of the leads 106. The strap 122 is adhered to the leads 106 and to the die 102 by solder or an epoxy-based adhesive that is both thermally and electrically conductive. Additional details regarding the manner in which the root 180 may be coupled to the leads 106 are described below with reference to FIGS. 10–12.

The flange portion 176 is substantially planar and has a lip 182 formed along side and end edges thereof. As shown, the lip 182 extends vertically away from the first surface 162 of the die 102 to create a space between the lip 182 and the first surface 162 of the die 102. Typically, a layer of conductive adhesive material, which is the epoxy 177 in this example, is disposed between the flange portion 176 and the first surface 162 of the die 102 to secure the flange portion 176 to the first surface 162 of the die 102. In this configuration, the epoxy 177 is substantially thicker between the lip 182 and first surface 162 of the die 102 than between the first surface 162 of the die 102 and other areas of the flange portion 176. The thicker epoxy between the lip 182 and first surface 162 of the die 102 aids in alleviating high stress regions around the edges of the flange portion 176.

The cover portion 170 of the strap 122 is substantially planar and includes first and second surfaces 186 and 188, respectively, and has a through hole 190 formed therein. The through hole 190 extends between the first and second surfaces 186 and 188 of the cover portion 170 and is defined by a sidewall 192. As shown in FIG. 2, the through hole 190 may comprise an elongated slot with semicircular ends. Of course, however, the shape of the through hole 190 may vary. For example, the through hole 192 may comprise a through hole having a circular or rectangular cross-sectional shape.

The through hole 190 is useful during the process of molding the encapsulant material 194 about the package components. The through hole 190 permits passage of molten encapsulant material 194 from adjacent the first surface 186 of the cover portion 170 through the through hole 190 and into a region adjacent the second surface 188 of the cover portion 170. Permitting the molten encapsulant material 194 to pass through the hole 190 also helps prevent the strap 122 from being disconnected during the molding process. A portion of the encapsulant material 194 fills the through hole 190.

The first surface 186 of the cover portion 170 is generally defined by a peripheral edge 189 and may be generally rectangular. As illustrated in FIG. 2, the peripheral edge 189 may include opposing curved indentations 191 adjacent the first and second connection portions 172 and 174 to facilitate bending the strap 122 into the respective cover portion 170 and first and second connection portions 172 and 174.

The encapsulant material 194 is at least partially molded about the aforementioned structures for insulation and protection and includes opposing horizontal exterior first and second surfaces 196 and 198. The first surface 196 of the encapsulant material 194 includes, and is generally defined by, a peripheral corner 197. The encapsulant material 194 also includes sidewalls 195, which taper from a corner 199 to the peripheral corner 197.

The first surface 186 of the cover portion 170 around the through hole 190 is not covered by the encapsulant material 194, but is exposed in and substantially coplanar and flush with the first surface 196 of the encapsulant material 194. The first surface 186 of the cover portion 170 radiates heat effectively to the exterior, since the first surface 186 is not covered with the encapsulant material 194. Such heat is typically generated at the die 102 and conducted through a thermal path including the flange portion 176 and the connection portion 174 of the strap 122 to the first surface 186 of the cover portion 170, where the heat may be dissipated from the first surface 186, such as by radiation.

Optionally, heat sink structures (not shown), including vertical protrusions, such as heat fins, heat pins, and the like may be attached to, or formed on, the first surface 186 of the cover portion 170 to provide additional heat dissipation capability to the package 100. The heat sink structures may be secured on the sow first surface 186 by a thermally conductive adhesive or thermal grease, for example.

As mentioned, the second surface 126 of the die pad 104 and the second surfaces 160 of the leads 116, 118, and 120 are exposed through the second surface 198 of the encapsulant material 194. In one embodiment, the exposed surfaces 126 and 160 are substantially coplanar and flush with the second surface 198 of the encapsulant material 194. The exposed second surface 126 of the die pad 104 and the second surfaces 160 of the leads 116, 118, and 120 (FIG. 3) radiate heat effectively to the exterior. Such heat is typically generated at the die 102 and conducted through thermal paths, which include the die pad 104 the leads 116, 118, and 120 and the second surfaces 126 and 160, respectively.

Additionally, the second surfaces 136 of the leads 106 are exposed through the second surface 198 of the encapsulant material 194. In one embodiment, the exposed second surfaces 136 are substantially coplanar and flush with the second surface 198 of the encapsulant material 194. The exposed second surfaces 136 radiate heat effectively to the exterior. Such heat is typically generated at the die 102 and conducted through a thermal path including the flange portion 176, connection portion 174, cover portion 170, connection portion 172, foot 180, and through the leads 106 to be radiated to the exterior via the exposed second surfaces 136. Further, heat from the die 102 may also be dissipated through the second surface 146 of the lead 114, which may be electrically and thermally coupled to the die 102.

Accordingly, this embodiment provides for multiple thermal paths for dissipation of heat generated at the die 102. Heat may be dissipated through the following exposed surfaces: the first surface 186 of the cover portion 170 of the strap 122, the second surface 126 of the die pad 104, the second surfaces 136 of the leads 106, the second surface 146 of the lead 114, and the second surfaces 160 of the leads 116–120, among other possibilities.

In an alternative embodiment, PMOSFET die 102 is inverted, so that the drain terminal of the die 102 may be electrically coupled to first surface 124 of die pad 104, and the source terminal of the die 102 is electrically coupled by the strap 122 to the leads 106. A bond wire (not shown) may be used to electrically couple the lead 146 to the gate terminal of the die 102.

Depending on the type of die 102, the lead 146 may be omitted, for instance, where the die 102 is a diode.

Figure 4:
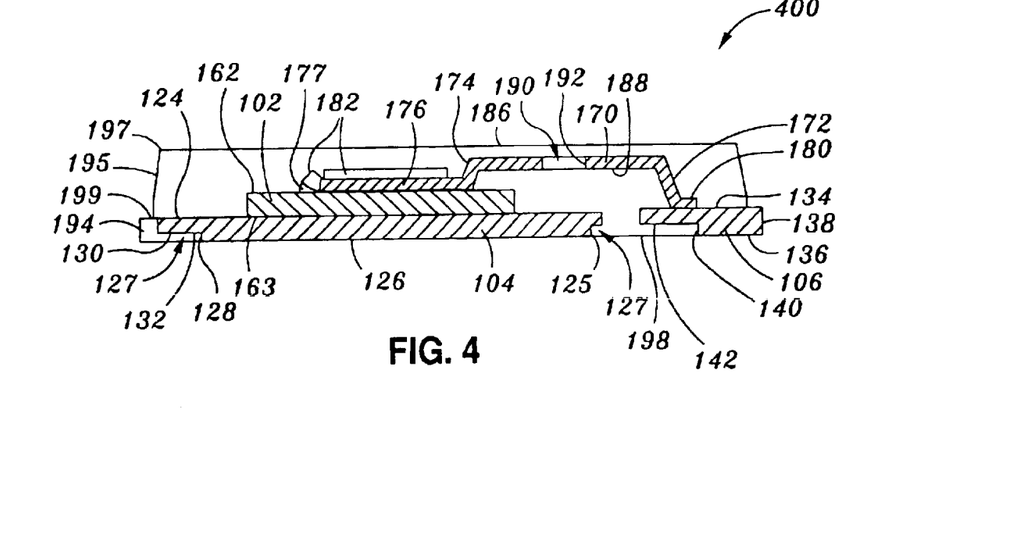
FIG. 4 is a cross-sectional side view of a semiconductor package in accordance with an embodiment of the present invention.
Figure 5:
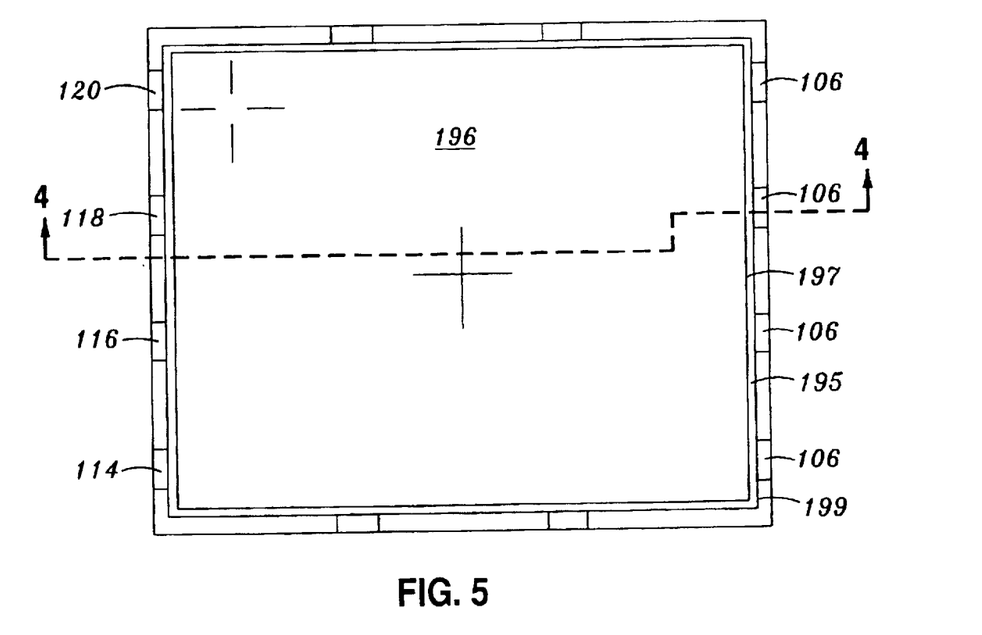
FIG. 5 is a top plan view of the semiconductor package of FIG. 4.
Figure 6:
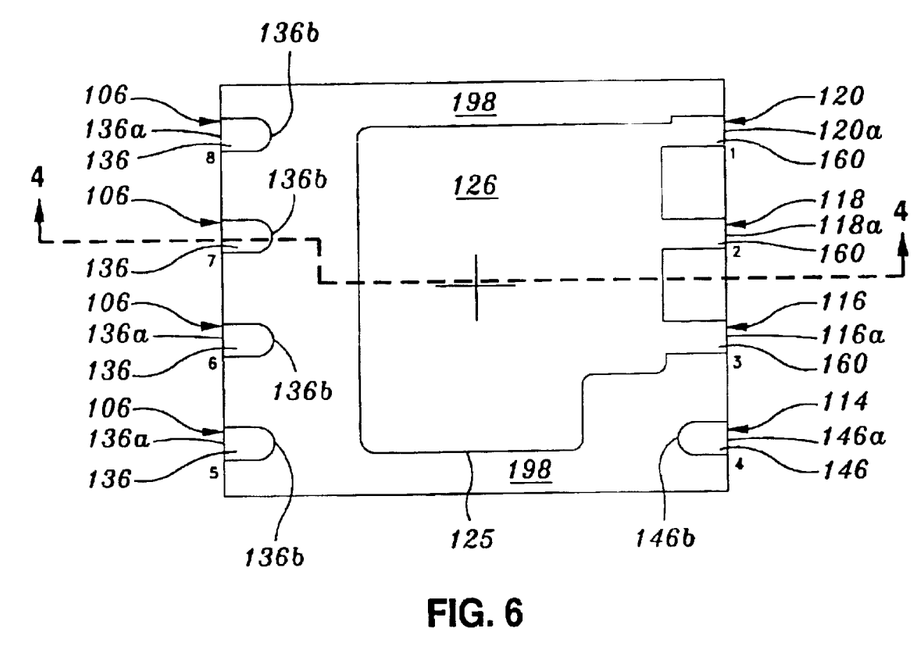
FIG. 6 is a bottom plan view of the semiconductor package of FIG. 4.

FIGS. 4–6 illustrate a semiconductor package 400 in accordance with another embodiment of the present invention. The semiconductor package 400 is similar to the semiconductor package 100 (FIGS. 1–3), and has common features, except as follows. Comparing FIGS. 4 and 5 to FIGS. 1 and 2, the first surface 186 of the cover portion 170 of package 400 is not exposed through the first surface 196 of the encapsulant material 194, but is encapsulated by the encapsulant material 194. Nonetheless, this embodiment provides for multiple thermal paths for dissipation of heat generated at the die 102. In this embodiment, heat may be dissipated through the following exposed surfaces: the second surface 126 of the die pad 104, the second surfaces 136 of the leads 106, the exposed surface 146 of the lead 114, and the second surfaces 160 of the leads 116–120. Of course, heat will also radiate through the thin layer of encapsulant material 194 over the first surface 186 of the cover portion 170 of the strap 122.

Figure 7:
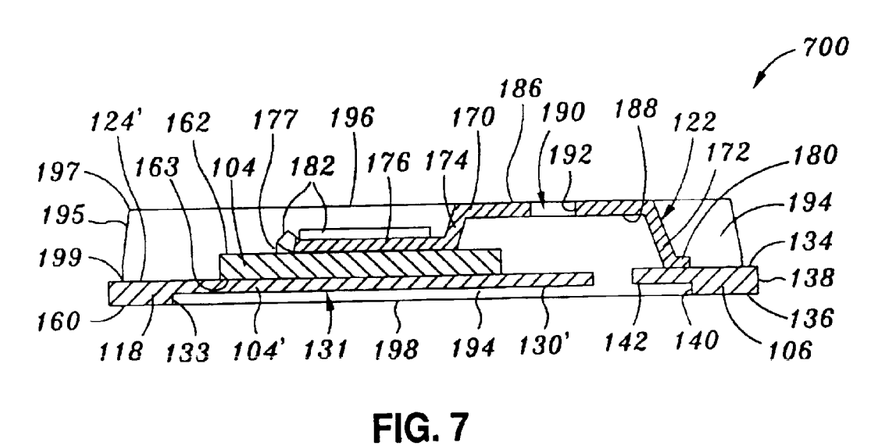
FIG. 7 is a cross-sectional side view of a semiconductor package in accordance with an embodiment of the present invention.
Figure 8:
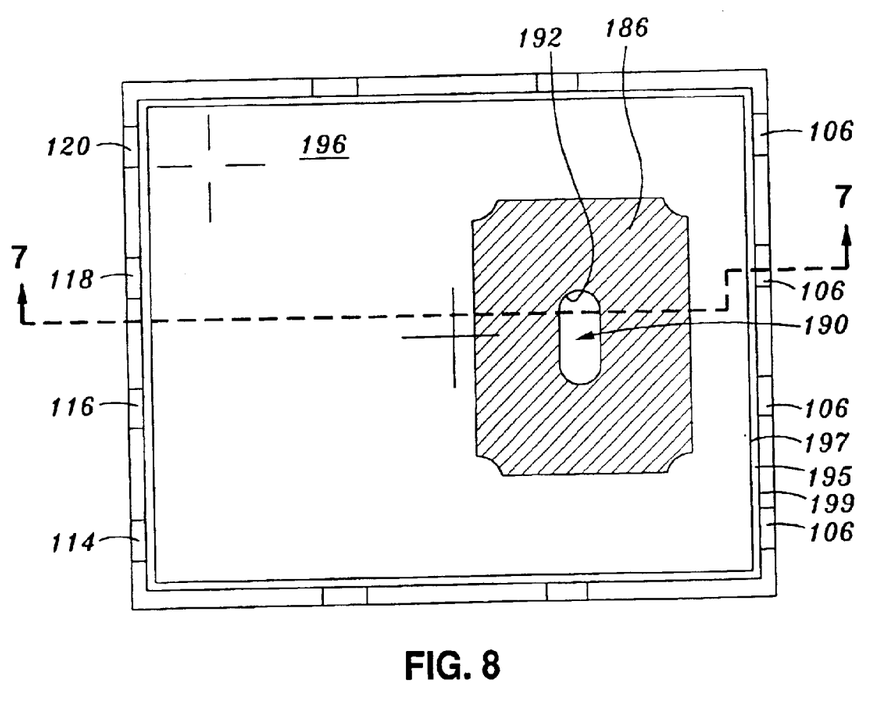
FIG. 8 is a top plan view of the semiconductor package of FIG. 7.
Figure 9:
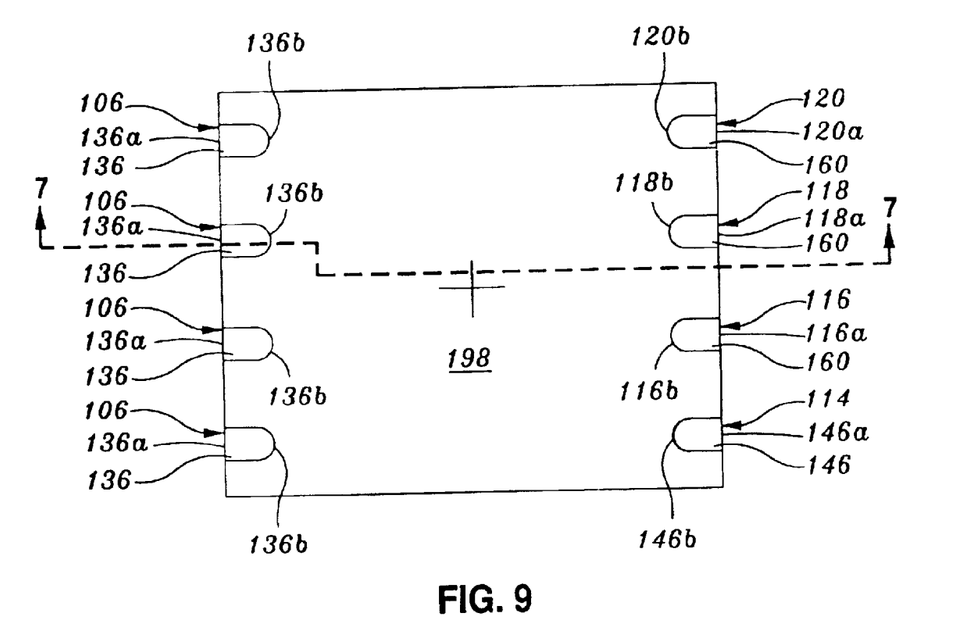
FIG. 9 is a bottom plan view of the semiconductor package of FIG. 7.

FIGS. 7–9 illustrate a semiconductor package 700 in accordance with another embodiment of the present invention. The semiconductor package 700 is similar to the semiconductor package 100 (FIGS. 1–3), and has common features, except as follows. The semiconductor package 700 includes a die pad 104' having opposing first and second surfaces 124' and 130'. The encapsulant material 194 encapsulates the second surface 130' of the die pad 104 in its entirety such that no portion of the second surface 130' is exposed through the encapsulant material 194. The leads 116, 118, and 120 (FIGS. 7 and 9) may be fused to or formed integrally with the die pad 104' and have respective second surfaces 160 that extend through the second surface 198 of the encapsulant material 194. The second surface 130' is recessed from the second surface 160 of the leads 116, 118, and 120 so that the encapsulant material 194 under-fills the second surface 130' within a recess 131 defined by the second surface 130' and orthogonal surface 133, thereby locking die pad 104 to the encapsulant material 194.

Package 700 provides multiple thermal paths for dissipation of heat generated at the die 102. Heat may be dissipated through the following exposed surfaces: the first surface 186 (FIG. 8) of the cover portion 170 of the strap 122, the second surfaces 136 (FIG. 9) of the leads 106, the second surface 146 (FIG. 9) of the lead 114, and the second surfaces 160 (FIG. 9) of the leads 116, 118, and 120, among other possibilities.

Figure 10:
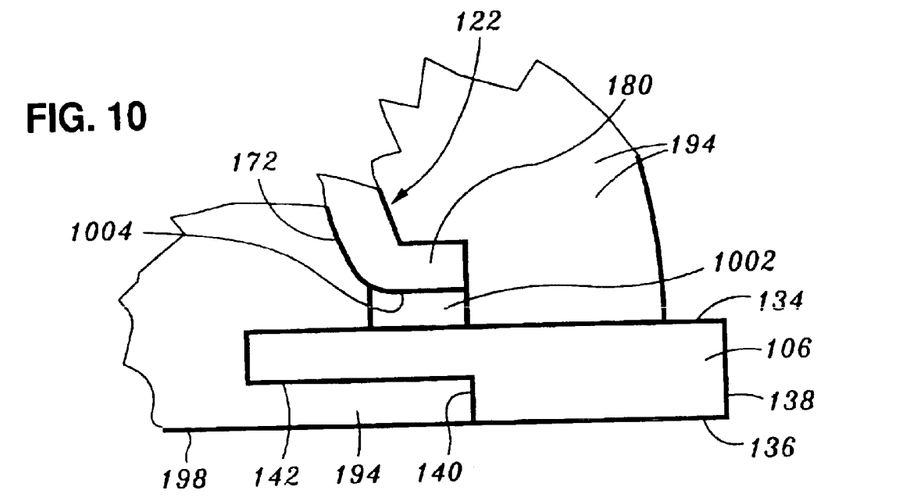
FIG. 10 is a breakaway cross-sectional side view of a strap foot in accordance with an embodiment of the present invention.
Figure 11:
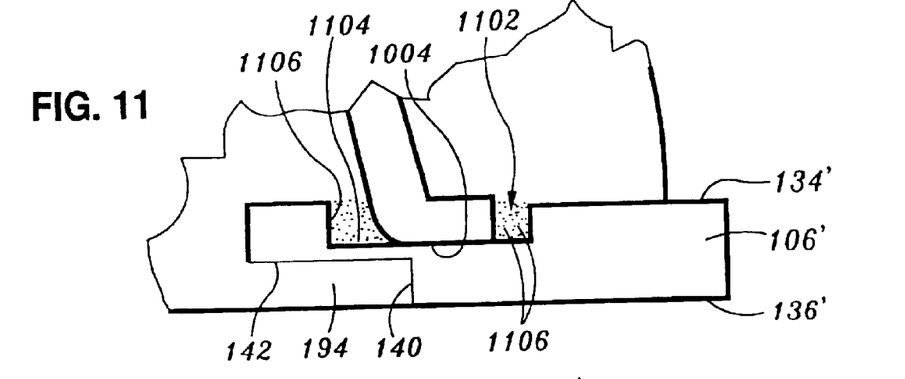
FIG. 11 is a breakaway cross-sectional side view of a strap foot in accordance with an embodiment of the present invention.
Figure 12:
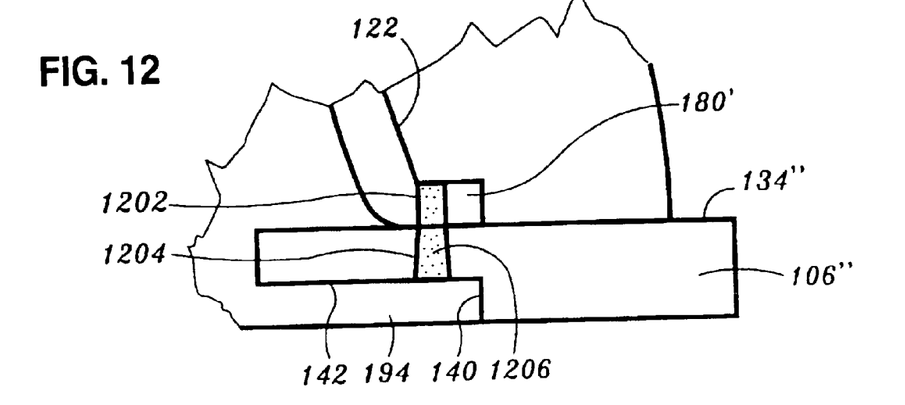
FIG. 12 is a breakaway cross-sectional side view of a strap foot in accordance with an embodiment of the present invention.

FIGS. 10–12 illustrate several embodiments of the foot 180 of the strap 122 and the lead 106.

FIG. 10 is a breakaway cross-sectional side view of the foot 180 of the strap 122 coupled to the first surface 134 of the lead 106 by a conductive layer 1002 in accordance with an embodiment of the present invention. The conductive layer 1002 thermally, electrically, and physically couples the foot 180 with the lead 106 and may comprise, for example, solder or a conductive adhesive. In one embodiment, the conductive layer 1002 comprises a conductive epoxy material. The conductive layer 1002 is disposed between the first surface 134 of the lead 106 and a transverse surface 1004 of the foot 180 to secure the foot 180 of the strap 122 to the first surface 134 of the lead 106. Thus, the strap 122 and the lead 106 are thermally, electrically, and physically coupled.

FIG. 11 is a breakaway cross-sectional side view of the foot 180 of the strap 122 coupled to the lead 106 in accordance with another embodiment of the present invention. In this embodiment, the lead 106' has opposing first and second surfaces 134' and 136', which are substantially parallel with each other. The lead 106' also includes a recess 1102 formed in the first surface 134' of the lead 106'. A recess floor 1104 and recess sidewalls 1106 define the recess 1102. The cross-sectional shape of the recess 1102 in the plane normal to FIG. 11 may comprise, for example, a circular or rectangular cross-sectional shape. The recess floor 1104 intersects and is substantially orthogonal to the recess sidewalls 1106. The exposed second surface 136' of the lead 106' is substantially planar, and recess 140 is under-filled with encapsulant material 194.

At least a portion, or all, of the foot 180 of the strap 122 is disposed within the recess 1102, depending on the relative depth of the recess 1102 and thickness of the foot 108. The transverse surface 1104 of the foot 180 may be positioned adjacent or against the recess floor 1104 as shown in FIG. 11. A conductive material 1106, such as solder or a conductive adhesive (e.g., conductive epoxy), is also disposed within the recess 1102 to thermally, electrically, and physically couple foot 180 of the strap 122 to the lead 1106'. The recess 1102 thus mechanically captivates the foot 180 so that significant horizontal movement between the foot 180 and the lead 106' is prevented. This facilitates placement of the strap 122 and may improve the integrity of the connection.

FIG. 12 is a breakaway cross-sectional side view of a foot 180' of a strap 122' coupled to a lead 106" in accordance with an embodiment of the present invention. In this embodiment, the foot 180' includes an aperture 1202. The lead 106" also includes an aperture 1204. As illustrated, the apertures 1202 and 1204 are substantially aligned such that their longitudinal axes are substantially coincident. A conductive material 1206, such as solder or a conductive adhesive (e.g., conductive epoxy) fills the apertures 1202 and 1204 and forms mechanically interlocking "key" therein when the conductive adhesive solidifies or hardens. The apertures 1202 and 1204 may each taper toward the first surface 134" of the lead 106" to enhance the interlocking effect of the hardened encapsulant material 1206.

The recess 1102 of FIG. 11 and the apertures 1202 and 1204 of FIG. 12 can be formed with a wide variety of known techniques, including photolithography and etching, electrical-discharge machining ("EDM"), stamping, punching, coining, laser-burning, or the like.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
    a die having a bottom surface and a top surface;
    a die pad having first and second surfaces, the bottom surface of the die being mounted to the first surface of the die pad;
    a plurality of leads, each of the leads having first and second surfaces, at least some of the leads being integrally connected to the die pad;
    a conductive strap electrically connected to and extending between the top surface of the die and the first surface of at least one of the leads which is not integrally connected to the die pad; and
    an encapsulant material encapsulating the die, at least a portion of the die pad, at least a portion of the conductive strap, and at least a portion of each of the leads such that the second surface of each of the leads is generally co-planar with an exterior surface of the encapsulant material.

2. The semiconductor package of claim 1 wherein a portion of the conductive strap is exposed in the encapsulant material.

3. The semiconductor package of claim 1 wherein at least a portion of the second surface of the die pad is exposed in the encapsulant material.

4. The semiconductor package of claim 1 wherein the conductive strap includes a through hole which is filled with the encapsulant material.

5. The semiconductor package of claim 1, wherein the conductive strap comprises:
    a first end portion coupled to the top surface of the die;
    a second end portion coupled to the first surface of at least one of the leads; and
    a central portion extending between the first and second end portions, the central portion having a through hole formed therein which is filled with the encapsulant material.

6. The semiconductor package of claim 1 wherein each of the leads includes a recessed portion which is adjacent to the second surface thereof and is filled with the encapsulant material.

7. The semiconductor package of claim 1 wherein the die pad has a recessed portion which is adjacent to and extends about the periphery of the second surface thereof, the recessed portion of the die pad being filled with the encapsulant material.

8. The semiconductor package of claim 1 wherein:
    the conductive strap includes a flange portion having the lip formed thereon;

a conductive layer is disposed between the flange portion and the top surface of the die and between the lip and the die; and the conductive layer has a first thickness adjacent to the lip and a second thickness adjacent to the flange portion, the first thickness exceeding the second thickness.

9. The semiconductor package of claim 1 wherein:

each of the leads has a recessed portion formed in the first surface thereof; and the conductive strap has a foot portion which is disposed in the recessed portion of at least one of the leads.

10. The semiconductor package of claim 1 wherein the conductive strap is secured to the first surface of at least one of the leads by a conductive layer.

11. A semiconductor package, comprising:

a die;

a die pad having first and second surfaces, the die being mounted to the first surface of the die pad;

a plurality of leads, each of the leads having first and second surfaces, at least some of the leads being integrally connected to the die pad;

a conductive strap electrically connected to and extending between the die and the first surface of at least one of the leads which is not electrically connected to the die pad; and an encapsulant material encapsulating the die, at least a portion of the die pad, at least a portion of the conductive strap, and at least a portion of each of the leads such that a portion of the conductive strap is exposed in and substantially flush with an exterior surface of the encapsulant material, at least a portion of the second surface of the die pad is exposed in and substantially flush with the exterior surface of the encapsulant material, and the second surface of each of the leads is exposed in and substantially flush with the exterior surface of the encapsulant material.

12. The semiconductor package of claim 11 wherein the conductive strap comprises:

a first end portion coupled to the die;

a second end portion coupled to the first surface of at least one of the leads; and a central portion extending between the first and second end portions, the central portion having a through hole formed therein which is filled with the encapsulant material.

13. The semiconductor package of claim 11 wherein each of the leads has a recessed portion which is adjacent to the second surface thereof and is filled with the encapsulant material.

14. The semiconductor package of claim 11 wherein the die pad has a recessed portion adjacent to and extending about the periphery of the second surface thereof, the recessed portion being filled with the encapsulant material.

15. The semiconductor package of claim 11 wherein:

the conductive strap includes a flange portion having a lip formed thereon;

a conductive layer is disposed between the flange portion of the conductive strap and the die and between the lip and the die; and the conductive layer has a first thickness adjacent to the lip and a second thickness adjacent to the flange portion, the first thickness exceeding the second thickness.

16. A semiconductor package, comprising:

a die;

a die pad having first and second surfaces, the die being mounted to the first surface of the die pad;

a plurality of leads, each of the leads having first and second surfaces, at least some of the leads being integrally connected to the die pad;

a conductive strap electrically connected to and extending between the die and the first surface of at least one of the leads which is not integrally connected to the die pad; and an encapsulant material encapsulating the die, at least a portion of the die pad, at least a portion of the conductive strap, and at least a portion of each of the leads such that the second surface of each of the leads is exposed in and substantially flush with an exterior surface of the encapsulant material;

each of the leads having a recessed portion adjacent to the second surface thereof which is filled with the encapsulant material, and the die pad having a recessed portion adjacent to and extending about the periphery of the second surface thereof, the recessed portion of the die pad being filled with the encapsulant material.

17. The semiconductor package of claim 16 wherein the conductive strap comprises a through hole which is filled with the encapsulant material.

18. The semiconductor package of claim 16 wherein at least a portion of the second surface of the die pad is exposed in and substantially flush with the exterior surface of the encapsulant material.

* * * * *